(12) United States Patent
    Oh

(10) Patent No.: US 11,139,363 B2
(45) Date of Patent: Oct. 5, 2021

(54) DISPLAY DEVICE FOR PREVENTING CRACKS CAUSED BY BENDING STRESS AND APPARATUS FOR MANUFACTURING THE SAME FOR REDUCING NUMBER OF MASK PROCESS

(71) Applicant: LG Display Co., Ltd., Seoul (KR)

(72) Inventor: Jae-Young Oh, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 13 days.

(21) Appl. No.: 16/716,275

(22) Filed: Dec. 16, 2019

(65) Prior Publication Data

US 2020/0203462 A1   Jun. 25, 2020

(30) Foreign Application Priority Data

Dec. 20, 2018   (KR) .................. 10-2018-0166581

(51) Int. Cl.
    *H01L 27/32* (2006.01)
    *H01L 51/52* (2006.01)

(52) U.S. Cl.
    CPC ........ *H01L 27/3276* (2013.01); *H01L 27/323* (2013.01); *H01L 51/5237* (2013.01); *H01L 2227/326* (2013.01)

(58) Field of Classification Search
    CPC .............. H01L 27/3276; H01L 27/323; H01L 27/3279; H01L 51/5237; H01L 2227/326
    See application file for complete search history.

(56) References Cited

U.S. PATENT DOCUMENTS

2013/0107476 A1*  5/2013  Wright ................. H05K 1/115
                                                    361/752
2017/0168025 A1*  6/2017  Wang .................. H01L 41/0475

* cited by examiner

*Primary Examiner* — Quoc D Hoang
(74) *Attorney, Agent, or Firm* — Polsinelli PC

(57) ABSTRACT

A display device comprises a substrate having through holes; a driving circuit board disposed at a lower surface of the substrate; signal pads disposed in the through holes; and conductive connectors each connected to the driving circuit board and a corresponding one of the signal pads, wherein the conductive connectors are surrounded by the corresponding signal pad in a corresponding one of the through holes to achieve reliability in a manufacturing process and a reduction in manufacturing costs by remove the bending area that can cause cracks caused by bending stress.

20 Claims, 13 Drawing Sheets

DISPLAY DEVICE FOR PREVENTING CRACKS CAUSED BY BENDING STRESS AND APPARATUS FOR MANUFACTURING THE SAME FOR REDUCING NUMBER OF MASK PROCESS

CROSS REFERENCE TO RELATED APPLICATION

This application claims the benefit of Korean Patent Application No. 10-2018-0166581 filed on Dec. 20, 2018, which is hereby incorporated by reference in its entirety.

BACKGROUND

Field of the Disclosure

The present disclosure relates to a display device, and more particularly to a display device capable of enhancing reliability in manufacturing and reduction in manufacturing costs and an apparatus for manufacturing the same.

Description of the Background

An image display device, which renders a variety of information on a screen, is a core technology of the information age. Such an image display device is developing towards enhanced thinness, enhanced lightness, and enhanced portability as well as enhanced performance. In connection with this, a flat display device capable of eliminating disadvantages of heavy and bulky structures of cathode ray tubes (CRTs) is highlighted.

Representative examples of such a flat display device may include 1a liquid crystal display (LCD) device, a plasma display panel (PDP), an organic light emitting display (OLED) device, an electrophoretic display (ED) device, and the like.

Such a flat display device includes a display panel formed with signal pads, and a driving circuit board on which a driving integrated circuit to be electrically connected to the signal pads is mounted. The driving circuit board is bonded to the signal pads such that the driving circuit board overlaps vertically with the signal pads.

In such a conventional display panel, the drive circuit board, which is attached to the signal pads, as mentioned above, is disposed in a bezel area where no image is rendered. For this reason, the conventional display device has difficulty realizing a narrow bezel.

In order to solve such a problem, a structure for bending the bezel area toward a lower surface of the substrate has been proposed. In this case, however, cracks may be generated during bending, due to bending stress, and, as such, degradation in reliability may occur. Furthermore, a mask process for removing a plurality of inorganic insulating layers functioning to generate cracks may be additionally required.

SUMMARY

Accordingly, the present disclosure is directed to a display device and an apparatus for manufacturing the same that substantially obviate one or more problems due to limitations and disadvantages of the related art.

The present disclosure provides a display device capable of achieving an enhancement in reliability and a reduction in manufacturing costs and an apparatus for manufacturing the same.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these aspects and other advantages and in accordance with the purpose of the disclosure, as embodied and broadly described herein, a display device includes conductive connectors respectively connected to signal pads disposed within through holes extending through a substrate. The conductive connectors are disposed to be surrounded by the signal pads within the through holes, respectively. Accordingly, it may be unnecessary to provide a bending area, differently from conventional cases. As a result, generation of cracks caused by bending stress may be prevented and, as such, an enhancement in reliability may be achieved.

The present disclosure may have the following effects. In accordance with the present disclosure, the conductive connectors connected to the signal pads disposed within the through holes extending through the substrate are disposed at the lower surface of the substrate. The conductive connectors are disposed to be surrounded by the signal pads within the through holes, respectively. In this case, it may be possible to minimize a bezel area without bending the bezel area because a driving circuit board connected to the conductive connectors is disposed at the lower surface of the substrate in accordance with the present disclosure. As a result, generation of cracks caused by bending stress may be prevented and, as such, an enhancement in reliability may be achieved. Furthermore, a mask process for removal of a plurality of inorganic insulating layers functioning to generate cracks is unnecessary. In this regards, the number of processes may be reduced and, as such, manufacturing costs can be reduced.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the present disclosure, illustrate aspect(s) of the disclosure and along with the description serve to explain the principle of the disclosure.

In the drawings.

DETAILED DESCRIPTION

Hereinafter, aspects of the present disclosure will be described in detail with reference to the accompanying drawings.

Figure 1:
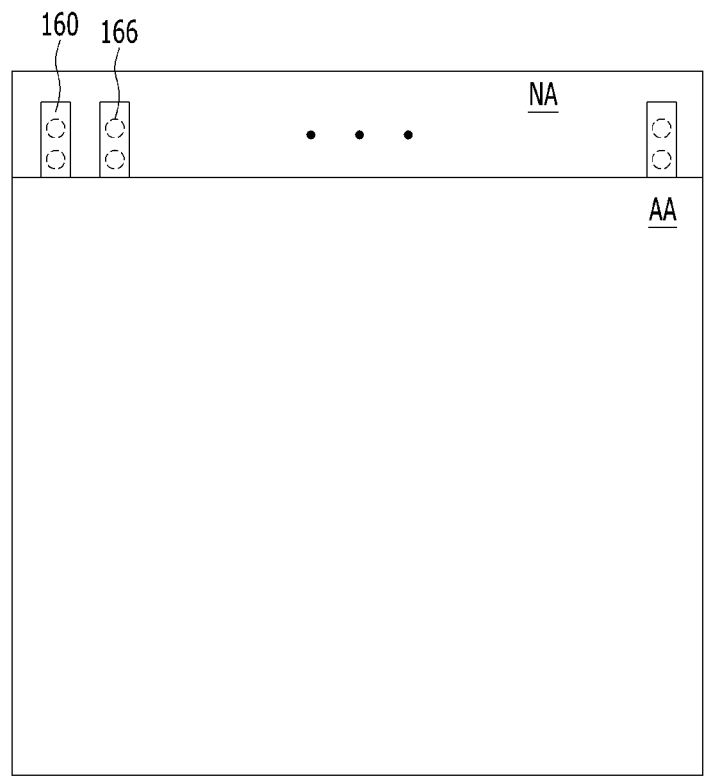
FIG. 1 is a plan view illustrating an organic light emitting display device according to the present disclosure.

FIG. 1 is a plan view illustrating an organic light emitting display device according to the present disclosure.

The display device illustrated in FIG. 1 has an active area AA and a non-active area NA.

Figure 2:
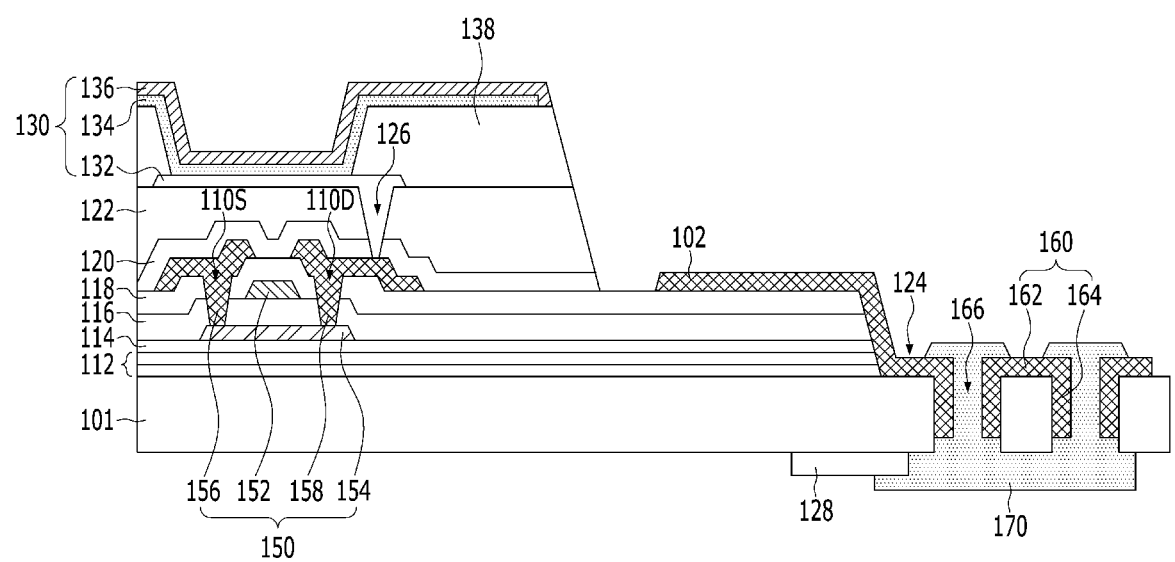
FIG. 2 is a sectional view illustrating an organic light emitting display device according to a first aspect of the present disclosure

The active area AA displays an image through unit pixels each including a plurality of subpixels rendering different colors. Referring to FIG. 2, which illustrates an organic light emitting display device according to a first aspect of the present disclosure, each subpixel includes a light emitting element 130, and a pixel driving circuit constituted by at least one thin film transistor 150 to independently drive the light emitting element 130.

The thin film transistor 150 includes an active layer 154 disposed on an active buffer layer 114, a gate electrode 152 overlapping with the active layer 154 under the condition that a gate insulating film 116 is interposed between the active layer 154 and the gate electrode 152, and source and drain electrodes 156 and 158 formed on the interlayer insulating film 118, to contact the active layer 154.

The active layer 154 is made of at least one of an amorphous semiconductor material, a polycrystalline semiconductor material and an oxide semiconductor material. The active layer 154 has a channel region, a source region and a drain region. The channel region overlaps with the gate electrode 152 under the condition that the gate insulating film 116 is interposed between the channel region and the gate electrode 152 and, as such, the channel region is defined between the source electrode 156 and the drain electrode 158. The source region is electrically connected to the source electrode 156 via a source contact hole 110S extending through the gate insulating film 116 and the interlayer insulating film 118. The drain region is electrically connected to the drain electrode 158 via a drain contact hole 110D extending through the gate insulating film 116 and the interlayer insulating film 118.

A multi-buffer layer 112 and an active buffer layer 114 are disposed between the active layer 154 and a substrate 101. The multi-buffer layer 112 functions to delay diffusion of moisture and/or oxygen penetrating into the substrate 101. The multi-buffer layer 112 may be formed over the entire upper surface of the substrate 101. The multi-buffer layer 112 may provide an environment capable of more stably realizing thin film formation while enabling more effective execution of various processes before execution of a main display panel fabrication process. The active buffer layer 114 performs functions of protecting the active layers 154 and blocking various kinds of defects propagated from the substrate 101. At least one of the multi-buffer layer 112, the active buffer layer 114 and the substrate 101 has a multilayer structure.

In this case, the uppermost layer of the multi-buffer layer 112 contacting the active buffer layer 114 is made of a material having etching characteristics different from those of the remaining layers of the multi-buffer layer 112, the active buffer layer 114 and the gate insulating layer 116. The uppermost layer of the multi-buffer layer contacting the active buffer layer 114 is made of one of SiNx and SiOx. The remaining layers of the multi-buffer layer 112, the active buffer layer 114 and the gate buffer layer 116 are made of the other of SiNx and SiOx. For example, the uppermost layer of the multi-buffer layer contacting the active buffer layer 114 is made of SiNx, whereas the remaining layers of the multi-buffer layer 112, the active buffer layer 114 and the gate buffer layer 116 are made of SiOx.

The light emitting element 130 includes an anode 132 connected to the drain electrode 158 of the thin film transistor 150, at least one light emitting stack 134 formed on the anode 132, and a cathode 136 formed on the light emitting stack 134, to contact a low-voltage supply line. Here, the low-voltage supply line supplies a voltage lower than a high voltage supplied through a high-voltage supply line.

The anode 132 is electrically connected to the drain electrode 158 of the thin film transistor 150 exposed through a pixel contact hole 126 extending through a passivation film 120 and a planarization layer 122, which are disposed on the thin film transistor 150. The anode 132 of each subpixel is disposed on the planarization layer 122 while being exposed through a bank 138.

When the anode 132 as described above is applied to a bottom emission type organic light emitting display device, the anode 132 is constituted by a transparent conductive film made of indium tin oxide (ITO) or indium zinc oxide (IZO). On the other hand, when the anode 132 is applied to a top emission type organic light emitting display device, the anode 132 is formed to have a multilayer structure including a transparent conductive film and an opaque conductive film having high reflection efficiency. The transparent conductive film is made of a material having a relatively great work function value, for example, indium tin oxide (ITO) or indium zinc oxide (IZO). The opaque conductive film is formed to have a single-layer structure or a multilayer structure including Al, Ag, Cu, Pb, Mo, Ti or an alloy thereof. For example, the anode 132 is formed to have a structure in which a transparent conductive film, an opaque conductive film and a transparent conductive film are sequentially laminated.

The light emitting stack 134 is formed by laminating a hole transport layer, a light emitting layer and an electron transport layer on the anode 132 in this order or in a reverse order.

The cathode 136 is formed on upper surfaces and side surfaces of the light emitting stack 134 and the bank 138, to face the anode 132 under the condition that the light emitting stack 134 is interposed between the anode 132 and the cathode 136.

The non-active area NA is the remaining area of the display device, except for the active area AA. A plurality of signal pads 160 to respectively supply drive signals to a plurality of signal lines 102 disposed in the active area AA is formed in the non-active area NA. Here, each signal line 102 includes at least one of a scan line, a data line, a high-voltage supply line and a low-voltage supply line.

Each of the signal pads 160 includes first and second pad electrodes 162 and 164.

The first electrode pad 162 extends from a corresponding one of the signal lines 102 while being disposed on a portion of the upper surface of the substrate 101 exposed through an insulating hole 124. In this case, the insulating hole 124 is formed to expose a corresponding portion of the upper surface of the substrate 101 through removal of portions of the multi-buffer layer 112, the active buffer layer 114, the gate insulating film 116 and the interlayer insulating film 118 disposed at a corresponding pad region of the non-active area NA in the substrate 101.

Figure 3A:
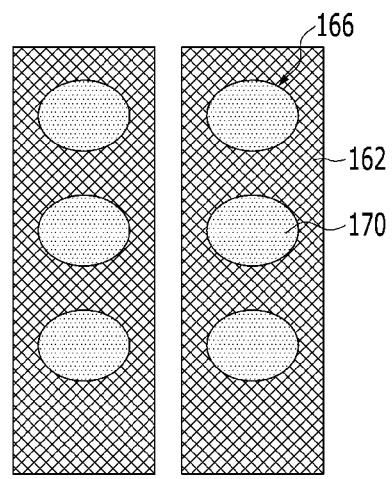
FIGS. 3A to 3C are plan views illustrating through holes shown in FIG. 2.
Figure 3B:
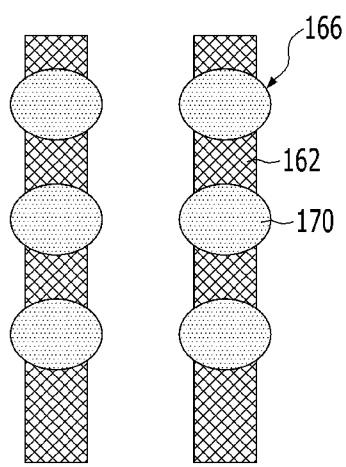
Figure 3C:
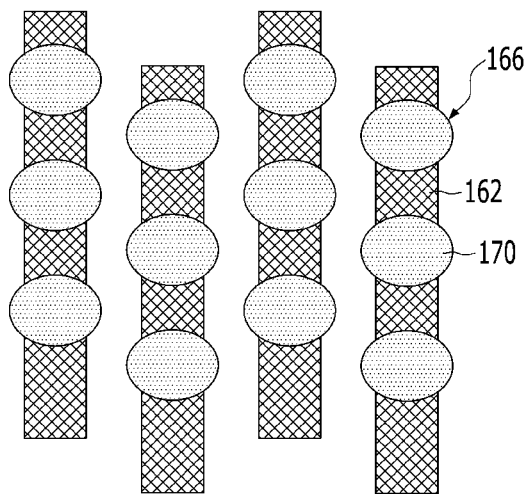

The second pad electrode 164 extends from the first pad electrode 162 while being disposed at side surfaces of the substrate 101 exposed by through holes 166 formed to extend through the substrate 101. Meanwhile, the through holes 166 extending through the substrate 101 have one of structures illustrated in FIGS. 3A to 3C. The through holes 166 illustrated in FIG. 3A are formed to have a narrower width than the first pad electrode 162. The through holes 166 illustrated in FIG. 3B are formed to have a wider width than the first pad electrode 162 which has a narrow width. The through holes 166 illustrated in FIG. 3C are formed such that the through holes 166 of adjacent ones of the first pad electrodes 162 alternate with each other. Accordingly, the structure of FIG. 3C may be employed in application of high resolution. The through holes 166 may have a circular, oval or polygonal shape.

The second pad electrode 164 as described above is formed to surround a conductive connector 170 within the through holes 166 and, as such, is electrically connected to the conductive connector 170 within the through holes 166. The conductive connector 170 is formed to have a multilayer structure made of a material having excellent conductivity, for example, silver (Ag), copper (Cu), or a combination thereof. The signal pad 166 is electrically connected to a driving circuit board 128 disposed at a lower surface of the substrate 101 via the conductive connector 170 as described above. The driving circuit board 128 may include a tape carrier package (TCP), a flexible printed circuit (FPC), a chip-on-film (COF) or the like, on which a driving integrated circuit is mounted. The driving circuit board 128 supplies a drive signal from the driving integrated circuit to the signal pad 160 via the conductive connector 170.

FIGS. 4A to 4E are sectional views explaining a method for fabricating the signal pad disposed within the through holes in accordance with the present disclosure.

Figure 4A:
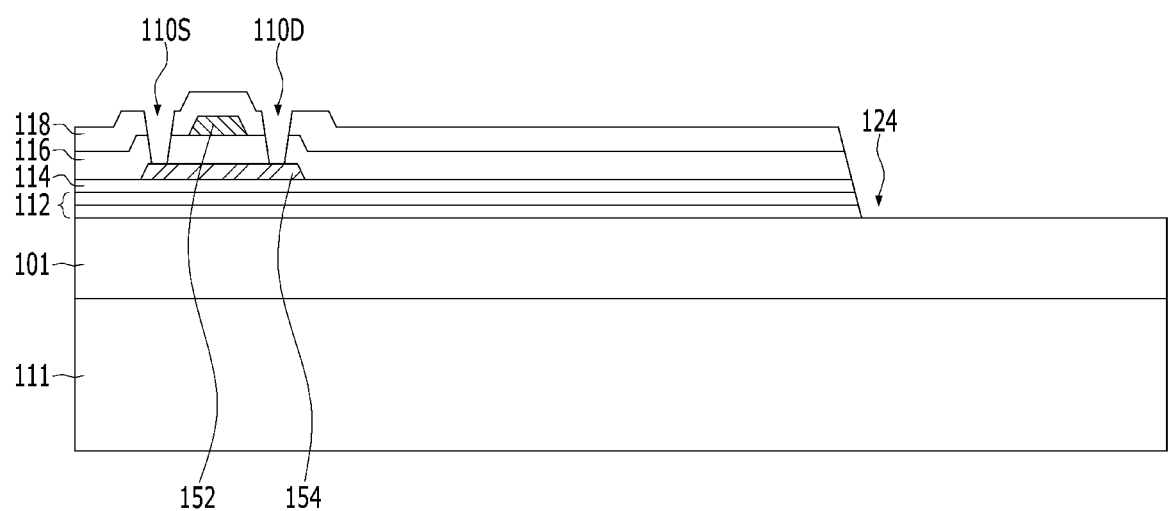
FIGS. 4A to 4E are sectional views explaining a method for manufacturing an organic light emitting display panel shown in FIG. 2.

First, the substrate 101 is seated on a support plate 111, as illustrated in FIG. 4A. The support plate 111 is made of a material harder than that of the substrate 101, for example, glass or the like. The substrate 101 may have a single-layer structure made of a flexible material such as polyimide or may have a multilayer structure including a first substrate layer made of a flexible material and a second substrate layer made of an inorganic insulating material such as SiO2. For example, the substrate 101 includes first substrate layers forming a double-layer structure while being made of a flexible material, and a second substrate layer interposed between the first substrate layers while being made of an inorganic insulating material.

The multi-buffer layer 112 and the active buffer layer 114 are sequentially formed on the seated substrate 101 through a deposition process. Subsequently, the active layer 154 is formed on the active buffer layer 114 through a photolithography process and an etching process. Thereafter, the gate insulating film 116 is formed on the substrate 101 formed with the active buffer layer 114 through a deposition process. The gate electrode 152 is then formed on the gate insulating film 116 through a photolithography process and an etching process. Subsequently, the interlayer insulating film 118 is formed over the entire upper surface of the substrate 101 formed with the gate electrode 152. The source contact hole 110S, the drain contact hole 110D and the insulating hole 124 are then formed through a photolithography process and an etching process. The insulating hole 124 is formed through removal of inorganic insulating films including portions of the multi-buffer layer 112, the active buffer layer 114, the gate insulating film 116 and the interlayer insulating film 118 disposed at the pad region where the signal pads 160 will be disposed.

In this case, the source contact hole 110S, the drain contact hole 110D and the insulating hole 124 may be simultaneously formed through the same mask process or may be separately formed through separate mask processes, respectively.

Figure 4B:
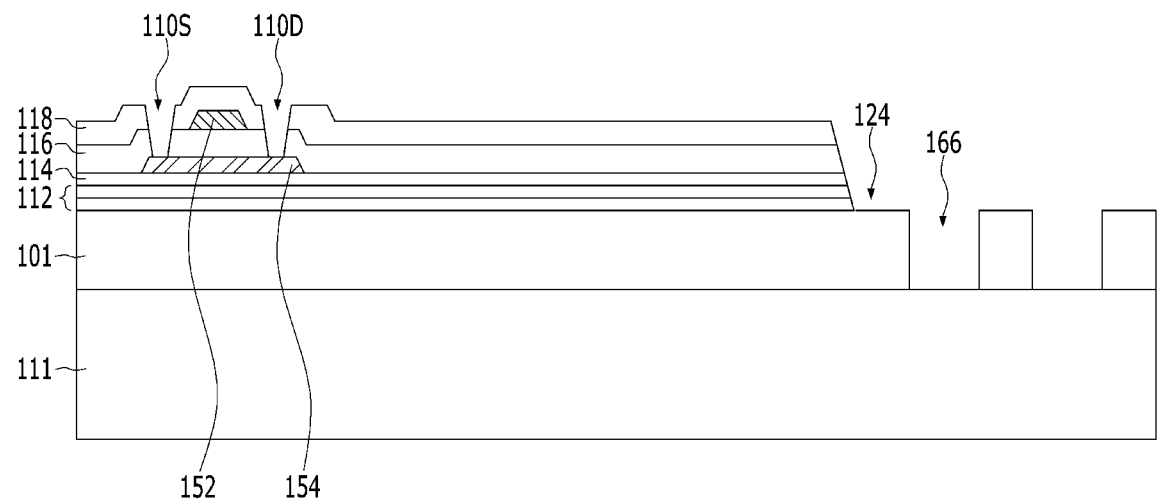

Thereafter, as illustrated in FIG. 4B, the through holes 166 are formed to extend through the substrate 101 in accordance with a patterning process using a laser.

Figure 4C:
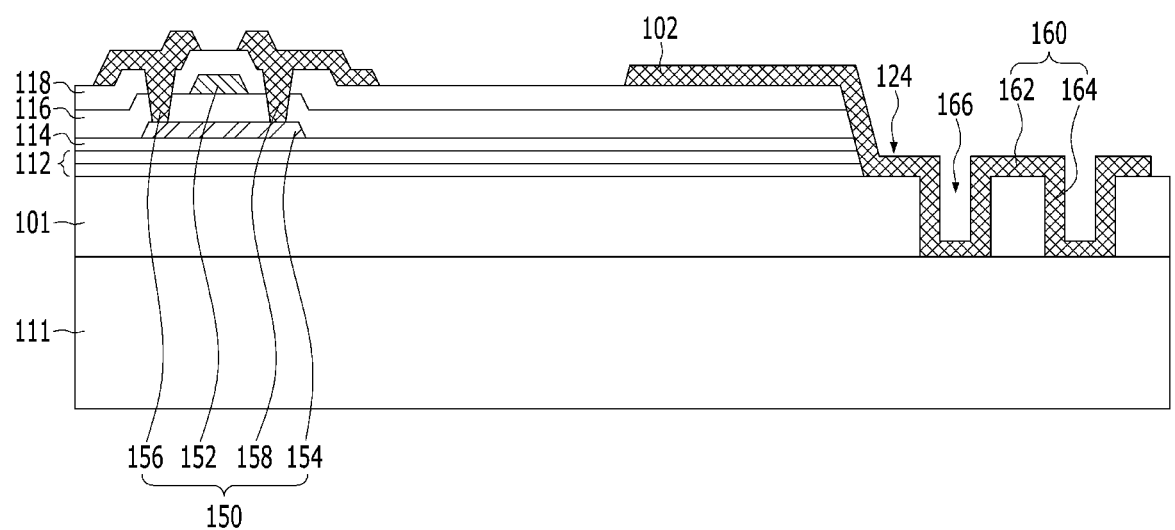

The source electrode 156, the drain electrode 158, the signal lines 162 and the signal pads 160 are then formed on the substrate 101 formed with the through holes 166 in accordance with a photolithography process and an etching process, as illustrated in FIG. 4C. In this case, the signal pads 160 are disposed at the upper surface of the substrate 101, the side surfaces of the substrate 101 and the support plate 111 and, as such, are connected to one another.

Figure 4D:
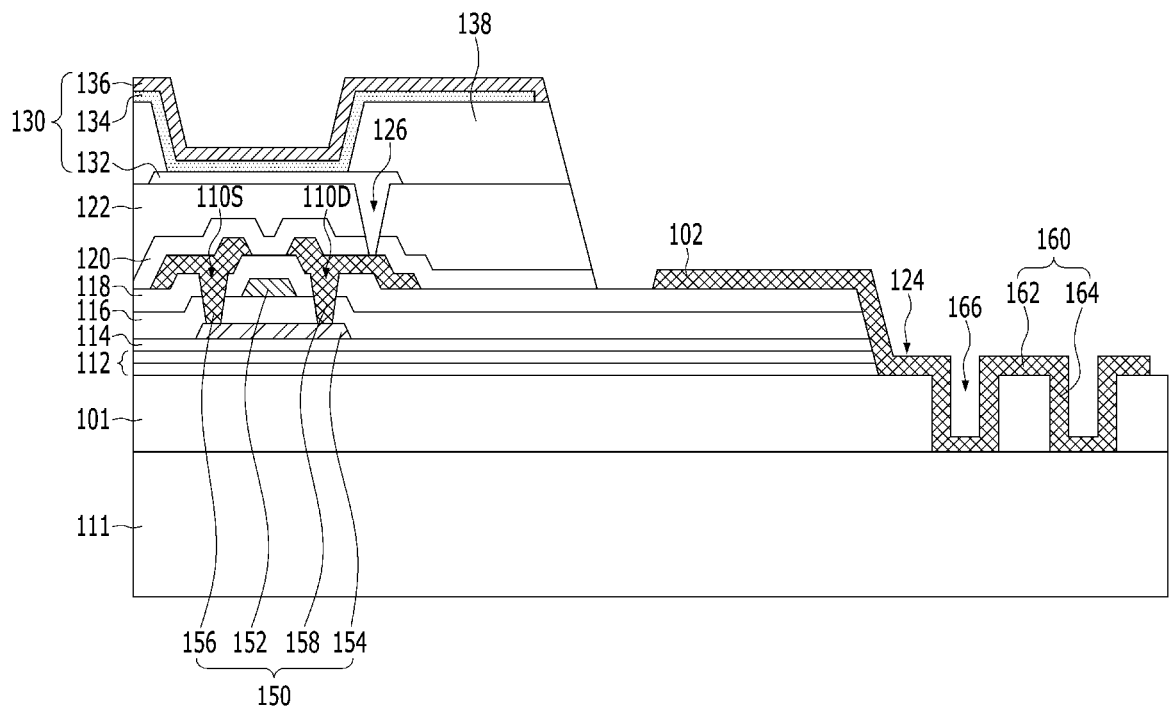
Figure 4E:
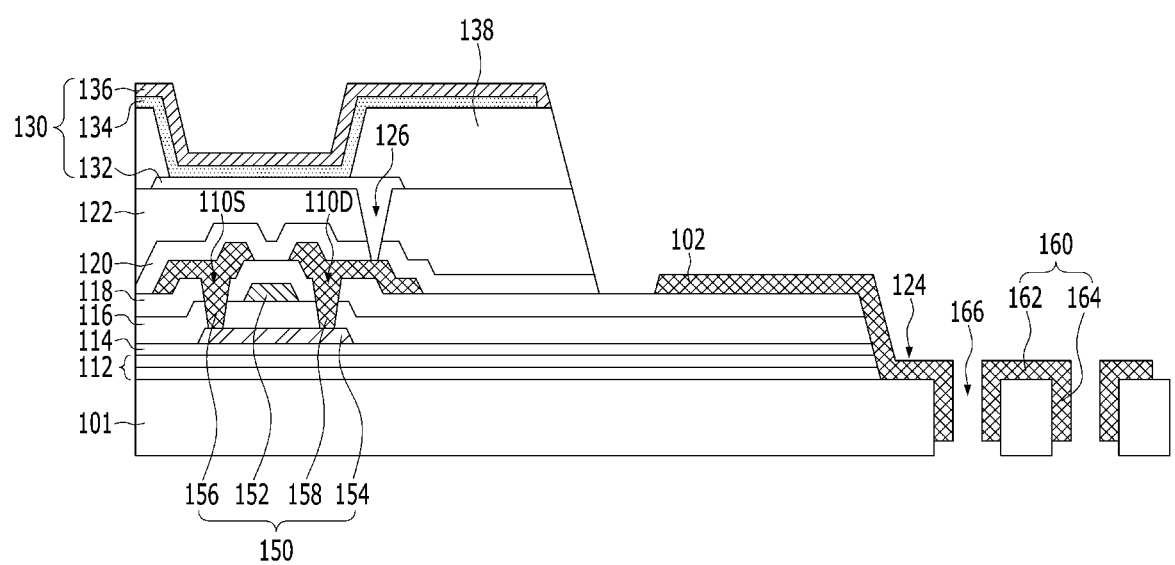

Thereafter, the passivation film 120 and the planarization film 122 are formed over the entire upper surface of the substrate 101 formed with the source electrode 156, the drain electrode 158, the signal lines 162 and the signal pads 160, as illustrated in FIG. 4D. The passivation film 120 and the planarization film 122 are then patterned through a photolithography process and an etching process, thereby forming the pixel contact hole 126. Subsequently, the anode 132 is formed on the substrate 101 formed with the pixel contact hole 126 through a photolithography process and an etching process. The bank 138 is then formed on the resulting structure of the substrate 101 through a photolithography process. Thereafter, the light emitting stack 134 and the cathode 136 are sequentially formed through a deposition process using a fine metal mask. Finally, as illustrated in FIG. 4E, the support plate 111 disposed at the lower surface of the substrate 101 is removed through a lift-off process. At this time, the signal pads 160 disposed at the support plate 111 are also removed.

As described above, in the illustrated first aspect of the present disclosure, the through holes 166 are formed through a patterning process using a laser in a state in which the inorganic insulating films have been removed from the pad region of the substrate 101. As a result, the contact area between each signal pad 160 and the conductive connector 170 associated therewith may be increased. On the other hand, when through holes are formed using a laser in a state in which inorganic insulating films are left at the pad region of the substrate, failure wherein the signal pad does not contact the conductive connector may occur. That is, the inorganic insulating films exhibit slower reaction to the laser than the substrate and, as such, the inorganic insulating films exposed through the through holes may have side surfaces further protruding than the side surfaces of the substrate exposed through the through holes, after formation of the through holes. When a signal pad is formed on the substrate formed with the above-described through holes, the signal pad cannot be formed at the side surfaces of the substrate, due to the inorganic insulating films further protruding than the side surfaces of the substrate. As a result, failure wherein the signal pad does not contact the conductive connector may occur.

Figure 5:
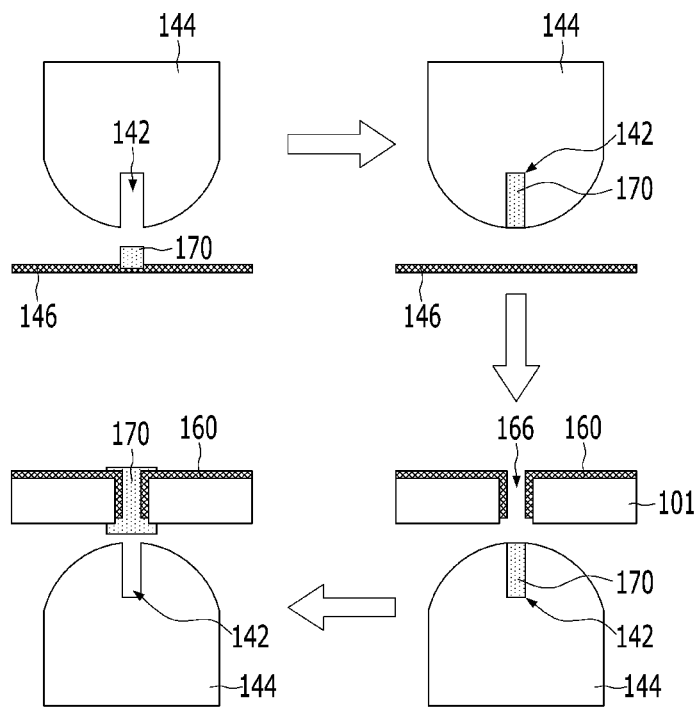
FIG. 5 is a view explaining a method for fabricating a conductive connector shown in FIG. 2 in accordance with the present disclosure.

FIG. 5 is a view explaining a method for fabricating the conductive connector in accordance with the present disclosure.

First, a printing plate 146 having concave and convex portions, and an elastic jig 144 having suction holes 142 are prepared. Paste-phase conductive connectors 170 are then formed at the concave or convex portions of the printing plate 146. Thereafter, the paste-phase conductive connectors 170 are sucked into the suction holes 142 of the elastic jig 144, which is made of a rubber material. The elastic jig 144, into which the paste-phase conductive connectors 170 have been sucked, is then aligned with the lower surface of the substrate 101. In this state, the paste-phase conductive connectors 170 are discharged into the though holes 166 of the substrate 101, and are then cured. As a result, the conductive connectors 170 are formed at respective through holes 166 of the substrate 101 and, as such, are electrically connected to the signal pads 160, respectively.

Figure 6:
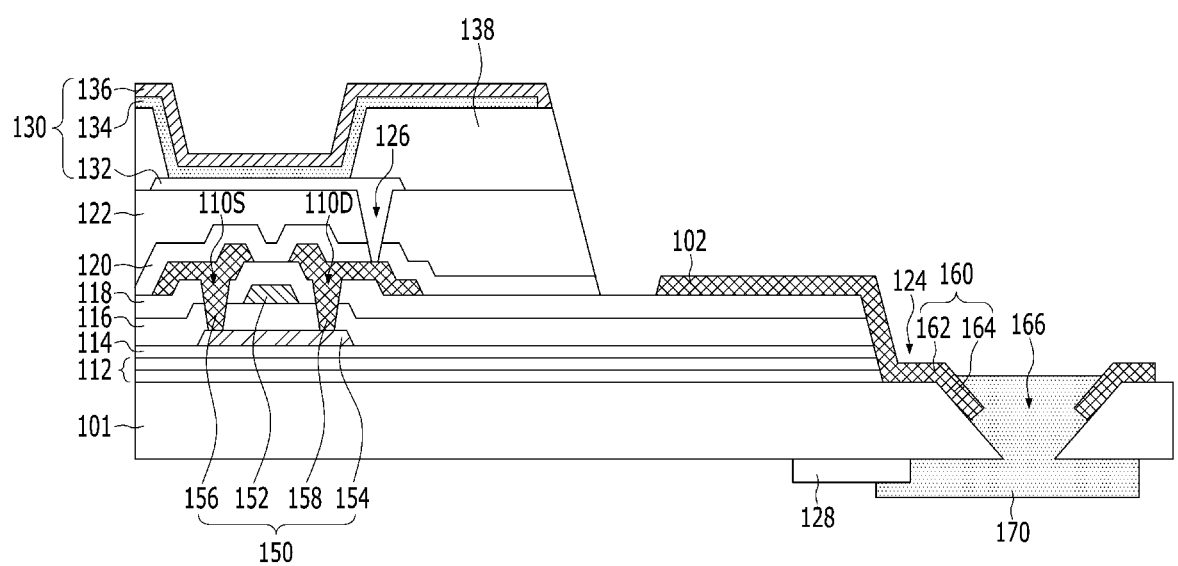
FIG. 6 is a sectional view illustrating an organic light emitting display device according to a second aspect of the present disclosure.

FIG. 6 is a sectional view illustrating an organic light emitting display device according to a second aspect of the present disclosure.

The organic light emitting display device illustrated in FIG. 6 includes the same constituent elements as those of the first aspect, except that inner side surfaces of the substrate 101 exposed through the through holes 166 are inclinedly formed. Accordingly, no detailed description will be given of the same constituent elements.

Each through hole 166 is formed to have a width gradually reduced as the through hole 166 extends from the upper surface of the substrate 101 to the lower surface of the substrate 101. Each inner side surface of the substrate 101 and the upper surface of the substrate 101, which are exposed through the through hole 166, are formed to form an obtuse angle therebetween. On the other hand, each inner side surface of the substrate 101 and the lower surface of the substrate 101, which are exposed through the through hole 166, are formed to form an acute angle therebetween.

The inner surfaces of the substrate 101 exposed through each through hole 166, which has a width reduced as the through hole 166 extends from the upper surface of the substrate 101 to the lower surface of the substrate 101, have a greater surface area than the inner side surfaces of the substrate 101 exposed through each through hole having a uniform width, which is illustrated in FIG. 2. As a result, the second pad electrode 164 disposed at the side surfaces of the substrate 101 exposed through each through hole 166, which has a width reduced as the through hole 166 extends from the upper surface of the substrate 101 to the lower surface of the substrate 101, also has a greater surface area than the second pad electrode 164 illustrated in FIG. 2.

FIGS. 7A to 7D are sectional views explaining a method for manufacturing the organic light emitting display device illustrated in FIG. 6.

Figure 7A:
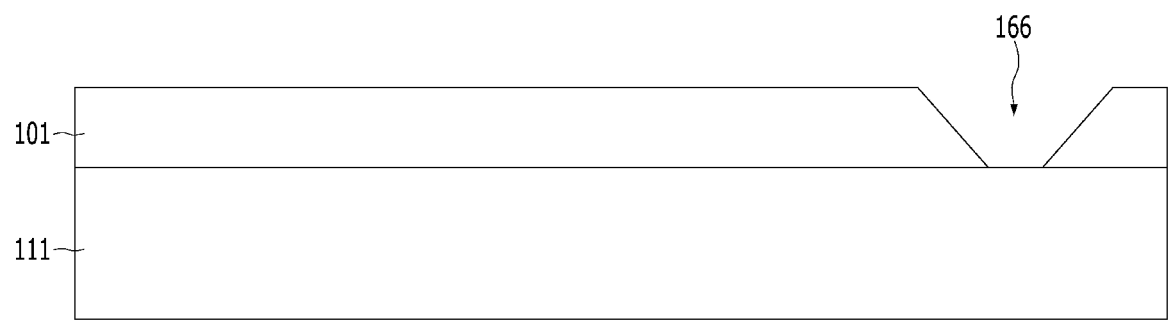
FIGS. 7A to 7D are sectional views explaining a method for manufacturing the organic light emitting display device shown in FIG. 6.
Figure 7B:
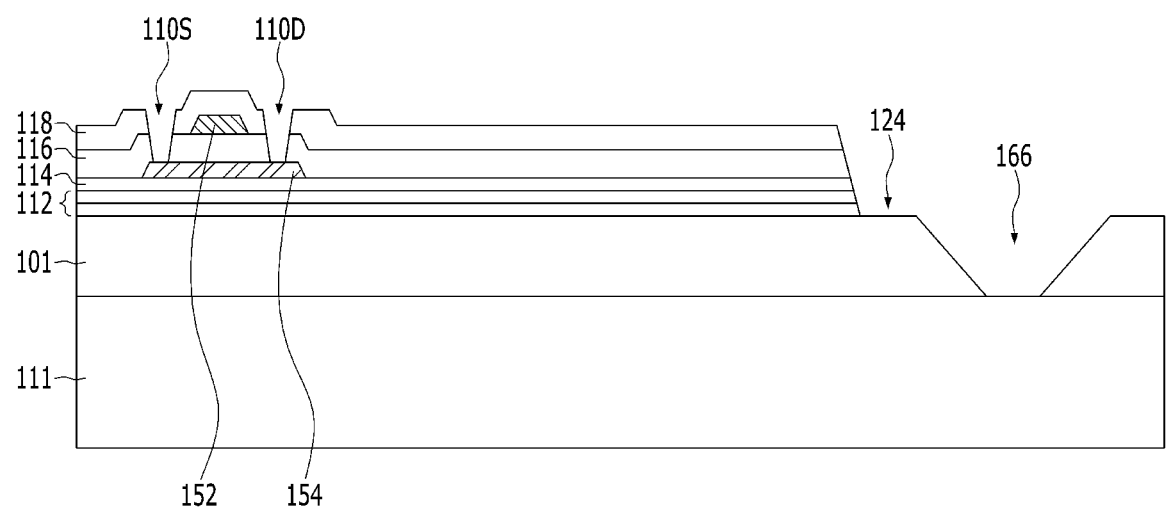

First, the substrate 101, which is made of a photosensitive material, is seated on the support plate 111, as illustrated in FIG. 7A. Thereafter, the through holes 166, which have inclined surfaces, are formed by patterning the substrate 101 through a photolithography process. As illustrated in FIG. 7B, the multi-buffer layer 112 and the active buffer layer 114 are then sequentially formed on the substrate 101 formed with the through holes 166 through a deposition process. Subsequently, the active layer 154 is formed on the active buffer layer 114 through a photolithography process and an etching process. Thereafter, the gate insulating film 116 is formed on the substrate 101 formed with the active buffer layer 114 through a deposition process. The gate electrode 152 is then formed on the gate insulating film 116 through a photolithography process and an etching process. Subsequently, the interlayer insulating film 118 is formed over the entire upper surface of the substrate 101 formed with the gate electrode 152. The source contact hole 110S, the drain contact hole 110D and the insulating hole 124 are then formed through a photolithography process and an etching process. The insulating hole 124 is formed through removal of inorganic insulating films including portions of the multi-buffer layer 112, the active buffer layer 114, the gate insulating film 116 and the interlayer insulating film 118 disposed at the pad region where the signal pads 160 will be disposed. In this case, the source contact hole 110S, the drain contact hole 110D and the insulating hole 124 may be simultaneously formed through the same mask process or may be separately formed through separate mask processes, respectively.

Figure 7C:
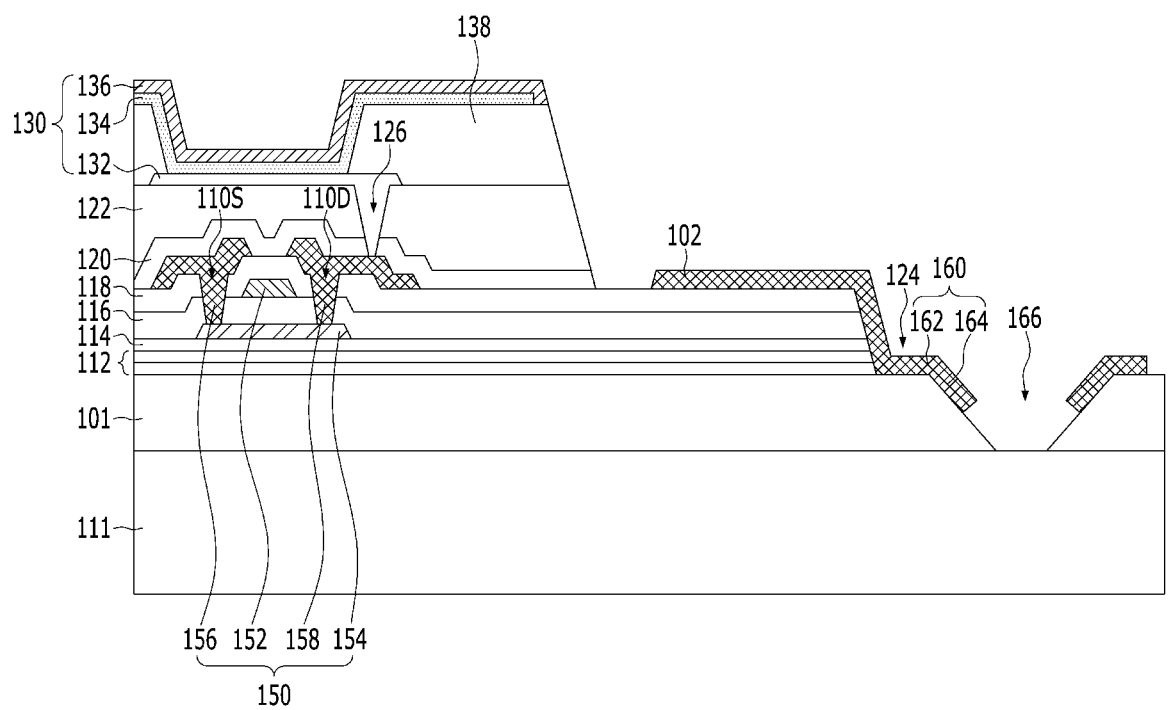

Thereafter, as illustrated in FIG. 7C, the through holes 166 are formed to extend through the substrate 101 in accordance with a patterning process using a laser. Subsequently, the source electrode 156, the drain electrode 158, the signal lines 162 and the signal pads 160 are formed on the substrate 101 formed with the source contact hole 110S, the drain contact hole 110D and the insulating hole 124 in accordance with a photolithography process and an etching process. In this case, the signal pads 160 are not formed at the support plate 111. The signal pads 160 are also not formed at portions of inner side surfaces disposed adjacent to the lower surface of the substrate 101.

Figure 7D:
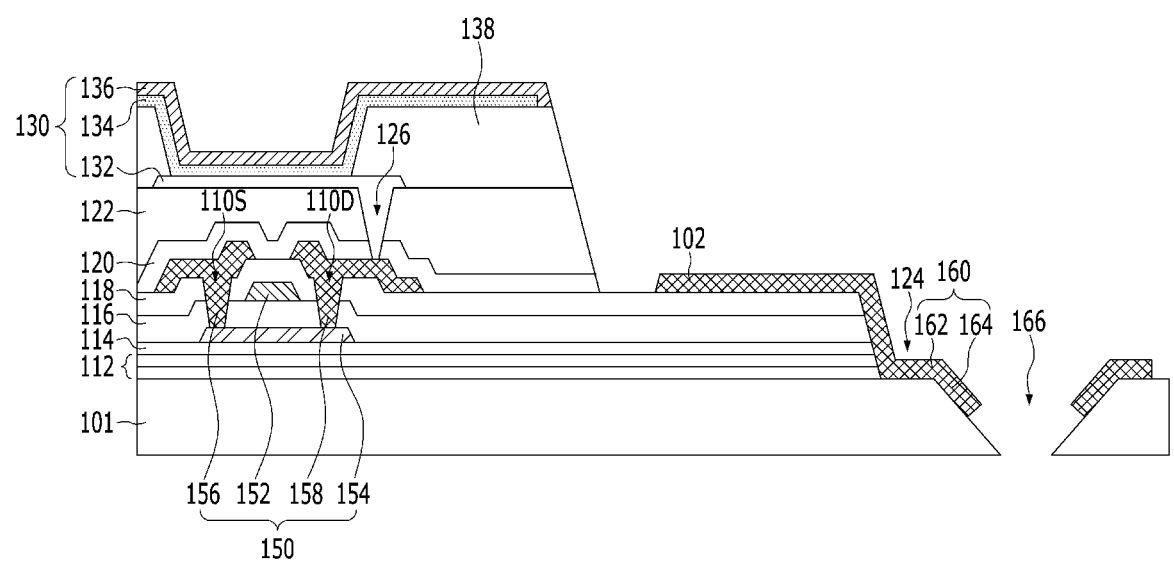

Thereafter, the passivation film 120, the planarization film 122, the anode 132, the bank 138, the light emitting stack 134 and the cathode 136 are sequentially formed on the substrate 101 formed with the source electrode 156, the drain electrode 158, the signal lines 162 and the signal pads 160 in accordance with the same manufacturing method as illustrated in FIG. 4D. Subsequently, the support plate 111 disposed at the lower surface of the substrate 101 is removed, as illustrated in FIG. 7D. Finally, the conductive connectors 170 are formed at the through holes 166 of the substrate 101, using the elastic jig 144 illustrated in FIG. 5, such that the conductive connectors 170 are electrically connected to the signal pads 160, respectively.

As described above, in the second aspect of the present disclosure, the signal pads 160 are formed in a state in which the inorganic insulating films have been removed from the pad region of the substrate 101. As a result, the contact area between each signal pad 160 and the conductive connector 170 associated therewith may be increased. On the other hand, when signal pads are formed in a state in which inorganic insulating films are left at the pad region of the substrate, inorganic insulating films disposed at the support plate may also be removed and, as such, the signal pads on the inorganic insulating films may be peeled off. As a result, the surface areas of the signal pads may be reduced and, as such, failure wherein the signal pads do not contact the conductive connectors associated therewith may occur.

Figure 8:
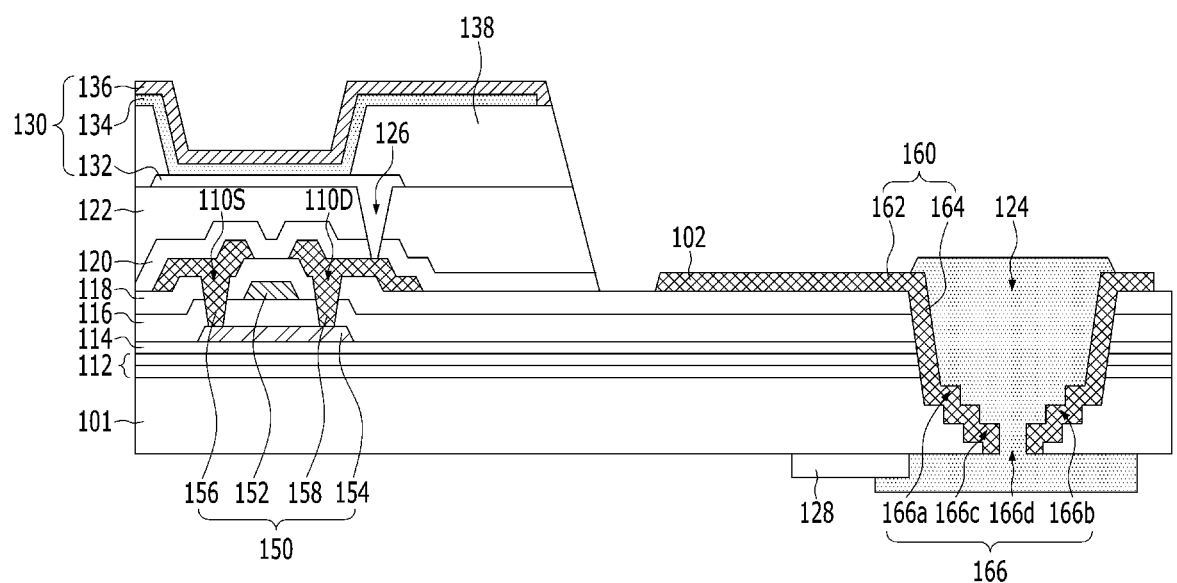
FIG. 8 is a sectional view illustrating an organic light emitting display device according to a third aspect of the present disclosure.

FIG. 8 is a sectional view illustrating an organic light emitting display device according to a third aspect of the present disclosure.

The organic light emitting display device illustrated in FIG. 8 includes the same constituent elements as those of the organic light emitting display device illustrated in FIG. 2, except that through holes are formed to have a multi-step structure. Accordingly, no detailed description will be given of the same constituent elements.

Each through hole 166 illustrated in FIG. 8 has a structure including a plurality of stepped through holes having widths reduced in a stepwise manner as the through hole 166 extends from the upper surface of the substrate 101 to the lower surface of the substrate 101. The following description will be given in conjunction with an example in which the through hole 166 has a structure including first to fourth inner holes 166a, 166b, 166c and 166d as stepped through holes.

The first inner hole 166a is formed to extend through a portion of the substrate 101 while having the same width as the insulating hole 124. The second inner hole 166b is disposed beneath the first inner hole 166a while having a smaller width than the first inner hole 166a. The third inner hole 166c is disposed beneath the second inner hole 166b while having a smaller width than the second inner hole 166b. The fourth inner hole 166d is disposed beneath the third inner hole 166c while having a smaller width than the third inner hole 166c.

The portion of the substrate 101 exposed through the through hole 166 having a multi-step structure with a width gradually reduced as the through hole 166 extends from the upper surface of the substrate 101 to the lower surface of the substrate 101 has a greater surface area than that of the portion of the substrate 101 exposed through the through hole having a uniform width as illustrated in FIG. 2. Accordingly, each signal pad 160 disposed at the inner side surfaces and upper surface of the substrate 101 exposed through the through hole 166 associated with the signal pad 160 also has a greater surface area than each signal pad 160 illustrated in FIG. 2. As such, the contact area between each pad 160 and the conductive connector 170 associated therewith is increased.

In addition, since each through hole 166 has a width gradually increasing as the through hole 166 extends from the lower surface of the substrate 101 to the upper surface of the substrate 101, it may be possible to enhance spreading of the paste-phase conductive connectors 170 when the paste-phase conductive connectors 170 are discharged using the elastic jig. Accordingly, it may be possible to easily form the conductive connectors 170 at the inner surfaces of the substrate 101.

FIGS. 9A to 9E are sectional views explaining a method for manufacturing the organic light emitting display device illustrated in FIG. 8.

Figure 9A:
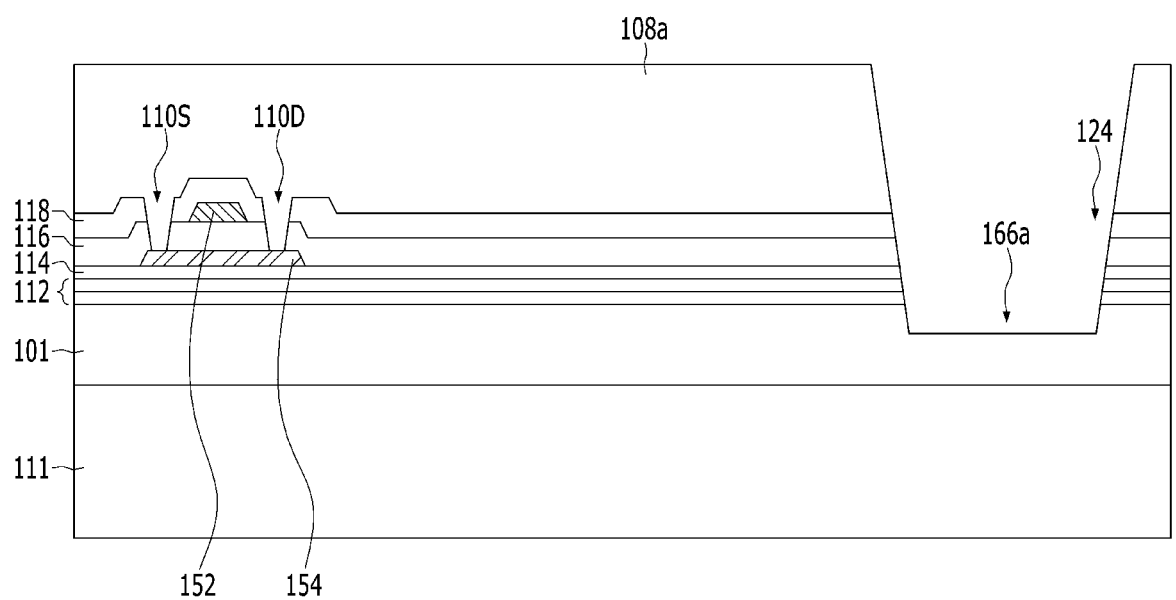
FIGS. 9A to 9E are sectional views explaining a method for manufacturing the organic light emitting display device shown in FIG. 8.
Figure 9B:
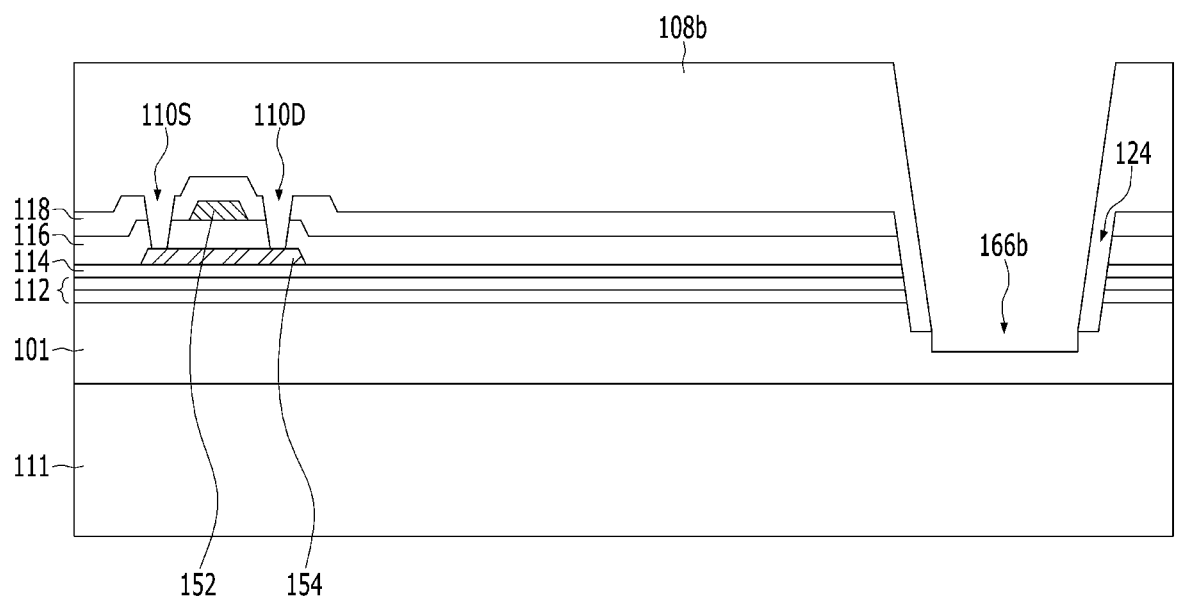
Figure 9C:
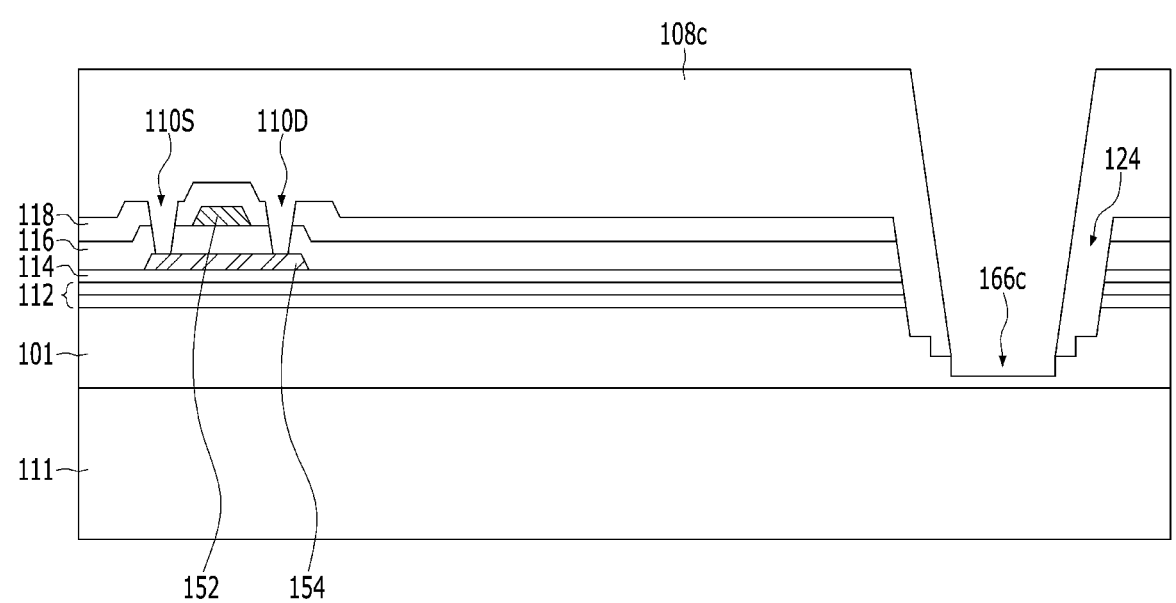
Figure 9D:
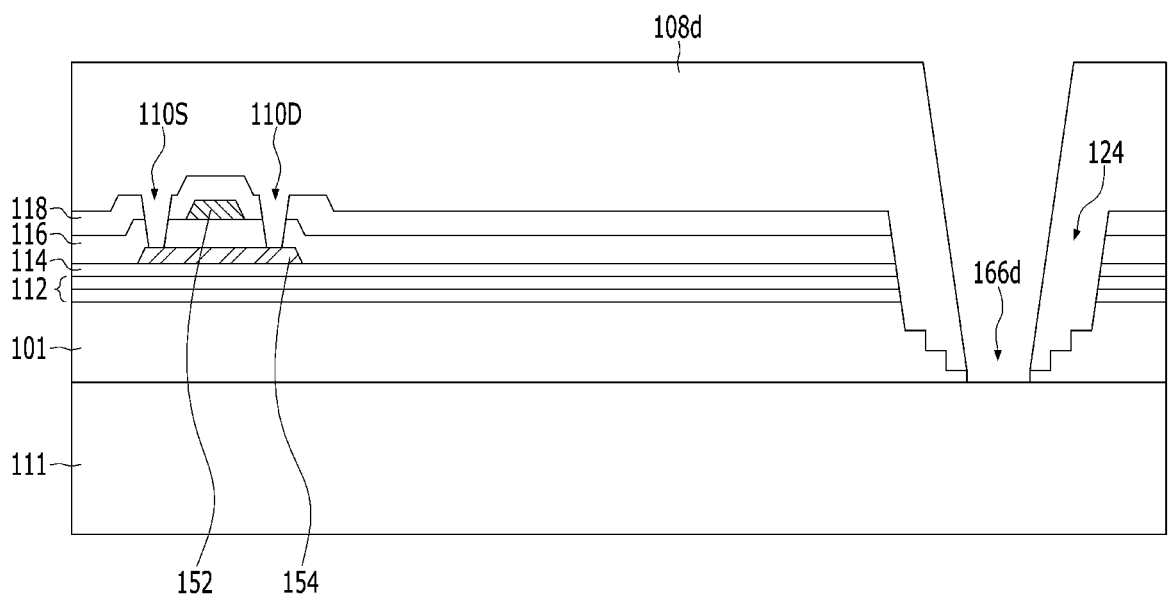
Figure 9E:
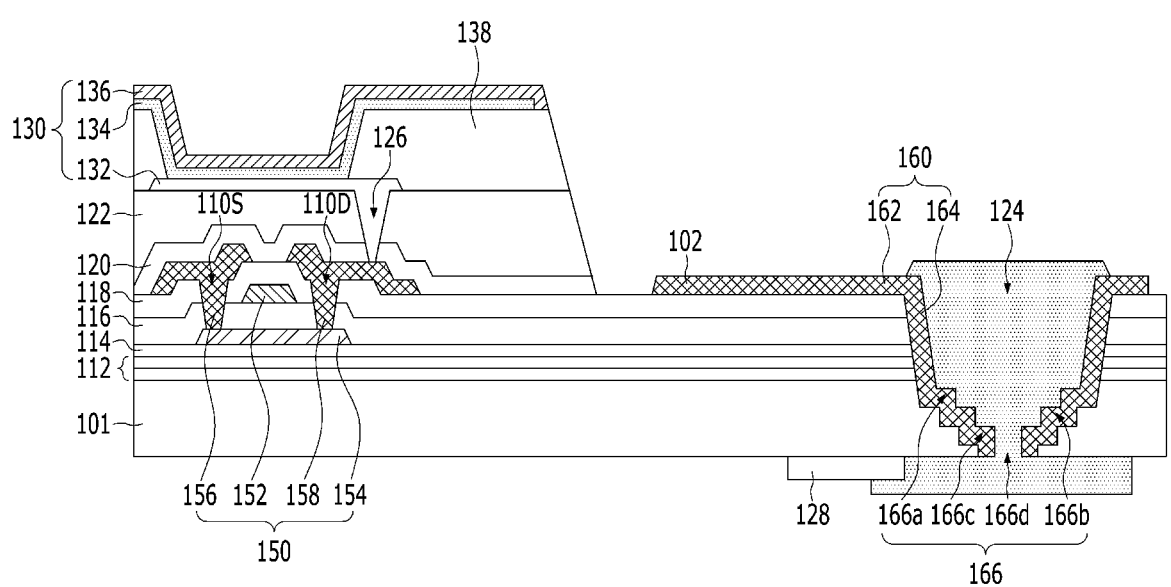

First, the substrate 101 is seated on the support substrate 111, as illustrated in FIG. 9A. Thereafter, the multi-buffer layer 112, the active buffer layer 114, the gate insulating film 116, the gate electrode 152, the interlayer insulating film 118, the source contact hole 110S and the drain contact hole 110D are sequentially formed on the substrate 101. Subsequently, a first photoresist pattern 108a is formed on the substrate 101 through light exposure and development processes. The multi-buffer layer 112, the active buffer layer 114, the gate insulating film 116 and the interlayer insulating film 118 are partially removed through an etching process using the photoresist pattern 108a as a mask, thereby forming an insulating hole 124. Thereafter, the first inner hole 166a is formed by etching a portion of the substrate 101 through an etching process using the first photoresist pattern 108a as a mask. In this case, the first inner hole 166a is formed to have the same width as the insulating hole 124. After removal of the first photoresist pattern 108a, a second photoresist pattern 108b is formed on the substrate 101 formed with the first inner hole 166a through light exposure and development processes, as illustrated in FIG. 9B. Thereafter, the second inner hole 166b is formed by etching a portion of the substrate 101 exposed through the first inner hole 166a in accordance with an etching process using the second photoresist pattern 108b as a mask. After removal of the second photoresist pattern 108b, a third photoresist pattern 108c is formed on the substrate 101 formed with the second inner hole 166b through light exposure and development processes, as illustrated in FIG. 9C. Thereafter, the third inner hole 166c is formed by etching a portion of the substrate 101 exposed through the second inner hole 166b in accordance with an etching process using the third photoresist pattern 108c as a mask. After removal of the third photoresist pattern 108c, a fourth photoresist pattern 108d is formed on the substrate 101 formed with the third inner hole 166c through light exposure and development processes, as illustrated in FIG. 9D. Thereafter, the fourth inner hole 166d is formed by etching a portion of the substrate 101 exposed through the third inner hole 166c in accordance with an etching process using the fourth photoresist pattern 108d as a mask. Subsequently, the source electrode 156, the drain electrode 158, the signal lines 162 and the signal pads 160 are formed on the substrate 101 in accordance with a photolithography process and an etching process, as illustrated in FIG. 9E. Thereafter, the passivation film 120, the planarization film 122, the anode 132, the bank 138, the light emitting stack 134 and the cathode 136 are sequentially formed on the substrate 101 formed with the source electrode 156, the drain electrode 158, the signal lines 162 and the signal pads 160 in accordance with the same manufacturing method as illustrated in FIG. 4D. Subsequently, the support plate 111 disposed at the lower surface of the substrate 101 is removed. Finally, the conductive connectors 170 are formed at the through holes 166 of the substrate 101, using the elastic jig 144 illustrated in FIG. 5, such that the conductive connectors 170 are electrically connected to the signal pads 160, respectively.

Figure 10:
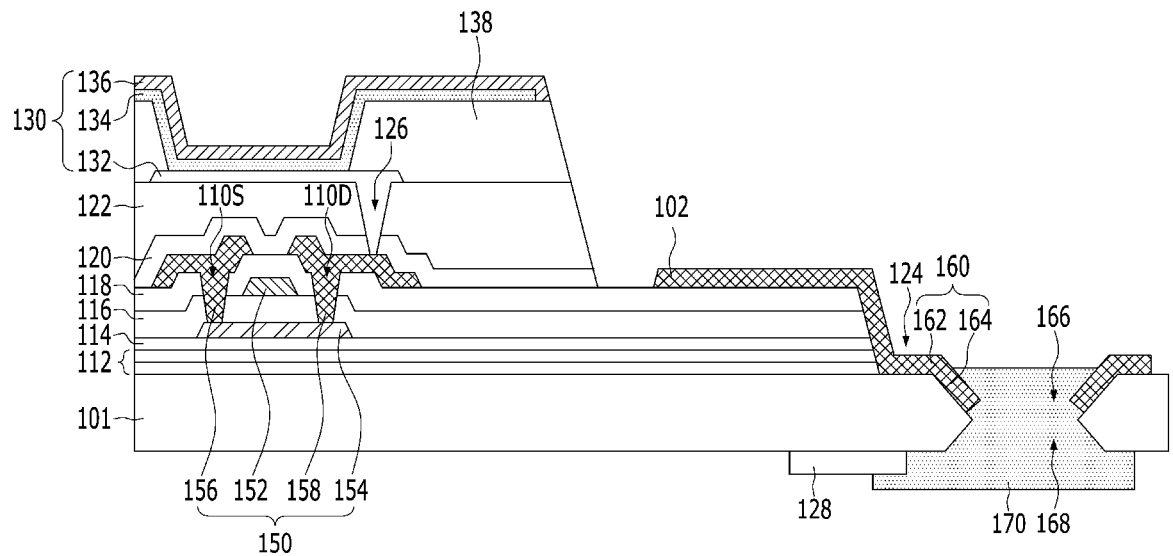
FIG. 10 is a sectional view illustrating an organic light emitting display device according to a fourth aspect of the present disclosure.

FIG. 10 is a sectional view illustrating an organic light emitting display device according to a fourth aspect of the present disclosure.

The organic light emitting display device illustrated in FIG. 10 includes the same constituent elements as those of the organic light emitting display device illustrated in FIG. 6, except that second through holes are additionally provided. Accordingly, no detailed description will be given of the same constituent elements.

Second through holes 168 are disposed beneath respective through holes 166. Each second through hole 168 is formed to have a width gradually reduced as the second through hole 168 extends from the lower surface of the substrate 101 toward an inside of the substrate 101.

Figure 11:
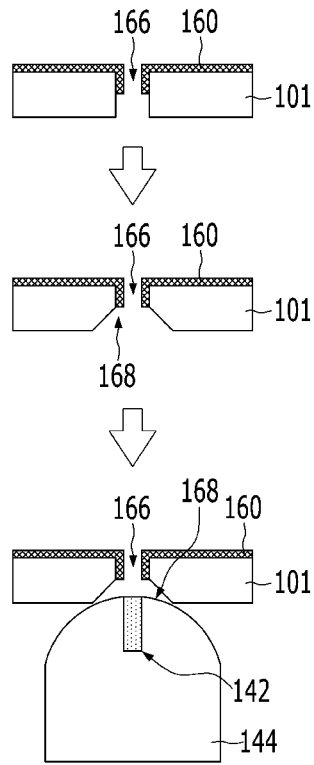
FIG. 11 is a sectional view explaining a method for fabricating a conductive connector using a second through hole shown in FIG. 10.

Each second through hole 168 is formed by partially removing a lower portion of the substrate 101, through a laser trimming process, after formation of the first through holes 166 and the signal pads 160, as illustrated in FIG. 11. Accordingly, the elastic jig 144 for formation of the conductive connectors 170 may be inserted into the second through holes 168. Since the elastic jig 144 may be aligned with the second through holes 168 within the second through holes 168, it may be possible to prevent failure caused by misalignment between the elastic jig 144 and the second through holes 168. In addition, insertion degree of the elastic jig 144 may be controlled in accordance with the width of the second through holes 168 and, as such, it may be possible to adjust the injection depth of the paste-phase conductive connectors 170.

Figure 12:
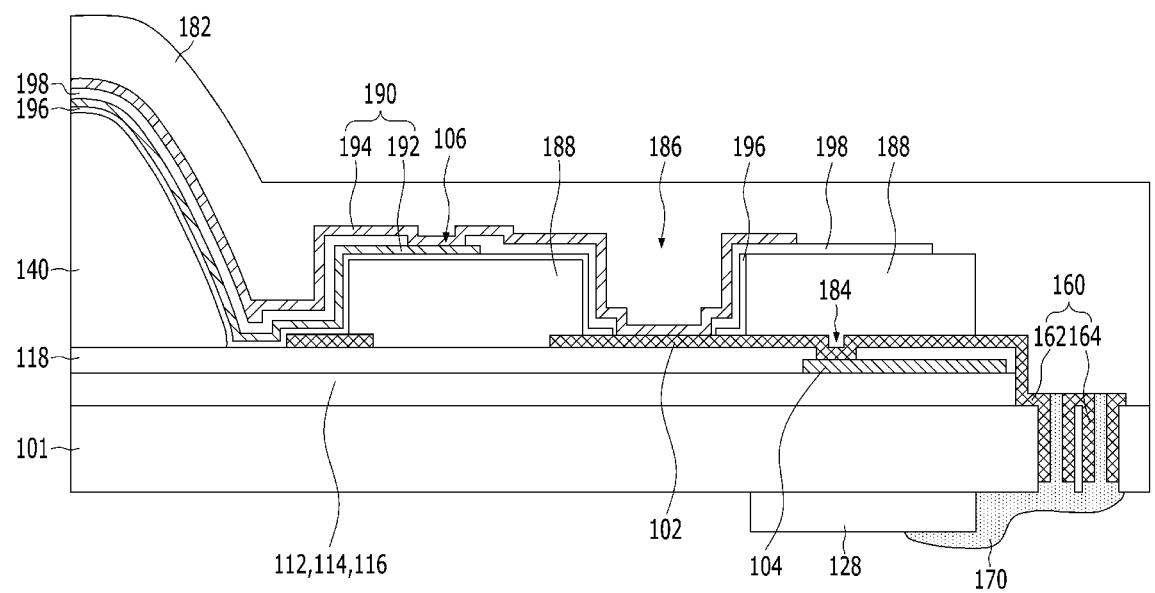
FIG. 12 is a sectional view illustrating an organic light emitting display device including a touch sensor in accordance with the present disclosure.

FIG. 12 is a sectional view illustrating an organic light emitting display device including a touch sensor in accordance with the present disclosure.

As illustrated in FIG. 12, an encapsulation unit 140 including an inorganic encapsulation layer and an organic encapsulation layer is disposed on each light emitting element, as illustrated in FIG. 12. A touch buffer film 196 is disposed on the encapsulation unit 140. A touch sensor including a touch electrode and a bridge is disposed on the touch buffer film 196.

A routing line 190 to supply a drive signal to the touch sensor is disposed between the touch sensor and an associated one of the signal pads 160. The routing line 190 includes first and second routing lines 192 and 194.

The first routing line 192 is made of the same material as the bridge, and is disposed on the touch buffer film 196. The second routing line 194 is made of the same material as the touch electrode, and is disposed on a touch insulating film 198. The second routing line 194 is electrically connected to a portion of the first routing line 192 exposed through a first contact hole 106 extending through the touch insulating film 198. In addition, at least one of the first and second routing lines 192 and 194 is electrically connected to a portion of the signal line 102 exposed through the second contact hole 186. The signal line 102 is electrically connected to an auxiliary signal line 104 via a third contact hole 184. In addition, the signal line 102 extends to the pad region, to be electrically connected to the associated signal pad 160.

At least one organic insulating layer 188 is disposed between the signal pad 160 and the encapsulation unit 140. The organic insulating layer 188 is made of an organic insulating material having higher elasticity than inorganic insulating materials. The organic insulating layer 188 exhibits higher strain than inorganic insulating materials. As such, the organic insulating layer 188 can reduce deformation stress generated at the substrate 101 made of a flexible material. Accordingly, the organic insulating layer 188 may prevent formation of cracks at the routing line 190 and the signal lines 102 and 104 disposed in the non-active area NA. As such, it may be possible to prevent propagation of cracks into the active area AA.

As apparent from the above description, in the present disclosure, the conductive connectors 170 respectively connected to the signal pads 160 disposed within the through holes 166 extending through the substrate 101 are disposed at the lower surface of the substrate 101 while being surrounded by the signal pads 160 within the through holes 166. In this case, the driving circuit board 128 connected to the conductive connectors 170 is disposed at the lower surface of the substrate 101 in accordance with the present disclosure and, as such, it may be possible to minimize the bezel area without bending the bezel area. In the present disclosure, accordingly, generation of cracks caused by bending stress may be prevented and, as such, an enhancement in reliability may be achieved. Furthermore, a mask process for removal of a plurality of inorganic insulating layers functioning to generate cracks is unnecessary. In this regard, the number of processes may be reduced and, as such, manufacturing costs may be reduced.

In addition, in the display device according to the present disclosure, the signal lines 102 are electrically connected to the driving circuit board 128 via the signal pads 160 disposed within the through holes 166 extending through the substrate 101 and the conductive connectors 170 formed at the lower surface of the substrate 101 and within the through holes 166. Accordingly, the display device of the present disclosure may secure a desired contact area between each signal pad 160 and the conductive connector 170 associated therewith and, as such, electrical resistance between the signal pad 160 and the conductive connector 170 may be reduced.

Figure 13:
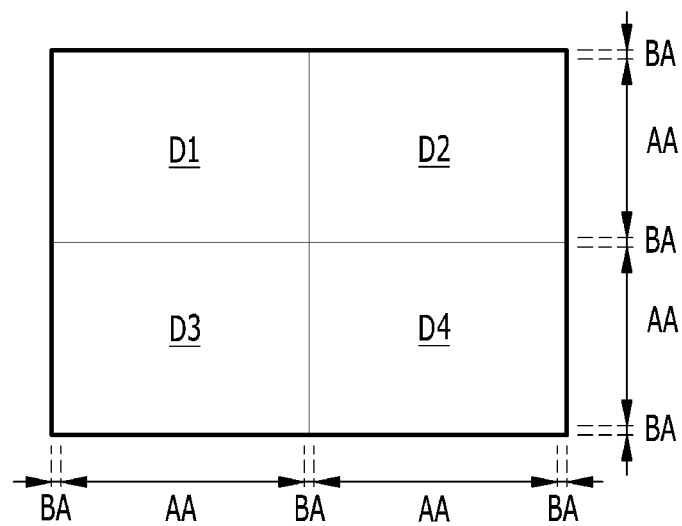
FIG. 13 is a plan view illustrating a multi-screen display device embodied using the display device according to the present disclosure.

Furthermore, in accordance with the present disclosure, it may be possible to embody a multi-screen display device having a large-size screen, as illustrated in FIG. 13, by connecting a plurality of display devices D1, D2, D3 and D4, each of which is one of the display devices illustrated in FIGS. 2, 6, 8, 10 and 12. In this case, it may be possible to minimize boundary areas among the display devices D1, D2, D3 and D4 connected to one another, as illustrated in FIG. 13, because the non-active area NA, that, is, the bezel area BA, in each of the display devices illustrated in FIGS. 2, 6, 8, 10 and 12 may be minimized.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A display device comprising:
a substrate having through holes;
a driving circuit board disposed at a lower surface of the substrate;
signal pads disposed in the through holes; and
conductive connectors each connected to the driving circuit board and a corresponding one of the signal pads,
wherein the conductive connectors are surrounded by the corresponding signal pad in a corresponding one of the through holes.

2. The display device according to claim 1, wherein each of the signal pads comprises:
a first pad electrode disposed on an upper surface of the substrate; and
a second pad electrode connected to the first pad electrode and disposed on a side surface of the substrate exposed through the corresponding one of through hole.

3. The display device according to claim 2, wherein each of the conductive connectors is surrounded by the second pad electrode of the corresponding one of the signal pads in the corresponding through hole.

4. The display device according to claim 1, wherein each of the through holes has a width gradually reduced as the through hole extends from the upper surface of the substrate to the lower surface of the substrate.

5. The display device according to claim 1, wherein each of the through holes has a width gradually reduced in a stepwise manner as the through hole extends from the upper surface of the substrate to the lower surface of the substrate.

6. The display device according to claim 1, wherein each of the through holes has a uniform or gradually reduced width at a portion thereof extending from the upper surface of the substrate toward an inside of the substrate while having a gradually increased width at a portion thereof extending from the lower surface of the substrate towards the inside of the substrate.

7. The display device according to claim 1, wherein each of the signal pads has a smaller or greater width than a width of the corresponding through hole.

8. The display device according to claim 1, wherein the through holes are laterally adjacent to ones of the signal pads and disposed to alternate each other.

9. The display device according to claim 1, further comprising a light-emitting element disposed on the substrate.

10. The display device according to claim 9, further comprising:
 an encapsulation unit disposed on the light-emitting element;
 a touch sensor disposed on the encapsulation unit; and
 a routing line connected to the touch sensor and the signal pads.

11. The display device according to claim 10, wherein the routing line disposed along a side surface of the encapsulation unit.

12. An apparatus for manufacturing a display device including conductive connectors connected to signal pads within through holes formed at a substrate comprising:
 a printing plate printed with the conductive connectors, which is in a paste phase; and
 an elastic jig provided with suction holes, the elastic jig sucking the conductive connectors through the suction holes and injecting the sucked conductive connectors into the through holes,
 wherein the elastic jig injects the conductive connectors into the through holes such that the conductive connectors are surrounded by the signal pads disposed within the through holes, respectively.

13. A display device comprising:
 a substrate having a plurality of through holes;
 a plurality of signal pads disposed in the through holes;
 a signal line disposed on the substrate and extended in the through holes;
 a driving circuit board disposed at a lower surface of the substrate; and
 a conductive connector electrically connecting the signal line and the signal pads with the driving circuit board, wherein the conductive connector is surrounded by a corresponding one of the signal pads in a corresponding one of the through holes.

14. The display device according to claim 13, wherein each of the signal pads comprises:
 a first pad electrode disposed on an upper surface of the substrate; and
 a second pad electrode connected to the first pad electrode and disposed on a side surface of the substrate exposed through the corresponding one of through hole.

15. The display device according to claim 14, wherein the conductive connector is surrounded by the second pad electrode of the corresponding one of the signal pads in the corresponding through hole.

16. The display device according to claim 13, wherein each of the through holes has a width gradually reduced as the through hole extends from the upper surface of the substrate to the lower surface of the substrate.

17. The display device according to claim 13, wherein each of the through holes has a width gradually reduced in a stepwise manner as the through hole extends from the upper surface of the substrate to the lower surface of the substrate.

18. The display device according to claim 13, wherein each of the through holes has a uniform or gradually reduced width at a portion thereof extending from the upper surface of the substrate toward an inside of the substrate while having a gradually increased width at a portion thereof extending from the lower surface of the substrate towards the inside of the substrate.

19. The display device according to claim 13, wherein the through holes are laterally adjacent to ones of the signal pads and disposed to alternate each other.

20. The display device according to claim 13, further comprising a light-emitting element disposed on the substrate.

* * * * *